United States Patent
Keupp et al.

(10) Patent No.: US 7,436,178 B2
(45) Date of Patent: Oct. 14, 2008

(54) FAST CONTINUOUS MOVING BED MAGNETIC RESONANCE IMAGING WITH MULTIPLE STATIONARY RECEIVE COILS FOR SENSE RECONSTRUCTION

(75) Inventors: Jochen Keupp, Hamburg (DE); Bernd Aldefeld, Hamburg (DE); Peter Boernert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 250 days.

(21) Appl. No.: 10/595,805

(22) PCT Filed: Nov. 3, 2004

(86) PCT No.: PCT/IB2004/052289

§ 371 (c)(1),
(2), (4) Date: May 12, 2006

(87) PCT Pub. No.: WO2005/047918

PCT Pub. Date: May 26, 2005

(65) Prior Publication Data

US 2007/0145977 A1   Jun. 28, 2007

Related U.S. Application Data

(60) Provisional application No. 60/520,139, filed on Nov. 14, 2003.

(51) Int. Cl.
*G01V 3/00* (2006.01)

(52) U.S. Cl. .................. 324/318; 324/309

(58) Field of Classification Search ......... 324/300–322; 600/407–422
See application file for complete search history.

(56) References Cited

U.S. PATENT DOCUMENTS 6,166,744 A * 12/2000 Jaszlics et al. ............... 345/629

(Continued)

FOREIGN PATENT DOCUMENTS

EP        1 398 642 A2        3/2004

(Continued)

OTHER PUBLICATIONS

Keupp, J., et al.; Continuous Moving Table SENSE Imaging; 2004; Proc. Intl. Soc. Mag. Reson. Med.; 11:324.

(Continued)

*Primary Examiner*—Brij B Shrivastav

(57) ABSTRACT

A plurality of global receive coils (24a, 24b, 24c) are stationarily positioned around a fixed field of view (FOV) of a magnetic resonance diagnostic imaging device (10). Each global receive coil receives undersampled phase and frequency encoded data from the stationary field of view. A subject is imaged as it moves continuously through the fixed field of view such that data is collected over a virtual field of view (vFOV) of the subject which is longer than the field of view in a longitudinal direction of subject motion. Centrally encoded k-space data, acquired from each of the global receive coils, is used to generate coil sensitivity patterns (42) which are mapped (44) from the stationary field of view to the virtual field of view. A SENSE reconstruction processor (54) performs a SENSE reconstruction on the virtual field of view data in which reconstructed data is combined and unfolded in accordance with the virtual field of view sensitivity patterns (48) to generate a virtual field of view image representation (60).

16 Claims, 3 Drawing Sheets

U.S. PATENT DOCUMENTS

| | | | |
|---|---|---|---|
| 6,552,540 B2 | 4/2003 | Fuderer | |
| 6,564,082 B2 * | 5/2003 | Zhu | 600/410 |
| 6,640,014 B1 * | 10/2003 | Price et al. | 382/255 |
| 6,946,836 B2 * | 9/2005 | Kuhara | 324/307 |
| 6,980,001 B2 * | 12/2005 | Paley et al. | 324/318 |
| 7,009,396 B2 * | 3/2006 | Zhu et al. | 324/309 |
| 7,336,076 B2 * | 2/2008 | Kuhara | 324/318 |
| 2002/0021128 A1 | 2/2002 | Kuhara | |
| 2003/0004408 A1 | 1/2003 | Zhu | |

FOREIGN PATENT DOCUMENTS

| | | |
|---|---|---|
| WO | WO2004/077086 A1 | 9/2004 |

OTHER PUBLICATIONS

Kruger, D.G., et al.; Continuously Moving Table Data Acquisition Method for Long FOV Contrast-Enhanced MRA and Whole-Body MRI; 2002; MRM; 47:224-231.

McKenzie, C.A., et al.; Self-Calibrating Parallel Imaging with Automatic Coil Sensitivity Extraction; 2002; MRM; 47:529-538.

Polzin, J.A., et al.; Correction for Gradient Field Distortions in Moving Table Imaging; 2002; Proc. Intl. Soc. Mag. Reson. Med.; 10:abstract.

Pruessmann, K.P., et al.; SENSE: Sensitivity Encoding for Fast MRI; 1999; MRM; 42:952-962.

Shetty, A.N., et al.; Lower Extremity MR Angiography: Universal Retrofitting of High-Field-Strength Systems with Stepping Kinematic Imaging Platforms-Initial Experience; 2002; Radiology; 222(1)284-291.

Zhu, Y.; FUSION for Incremental Field-of-View Imaging; 2001; Proc. Intl. Soc. Mag. Reson. Med.; 9:9.

* cited by examiner

FAST CONTINUOUS MOVING BED MAGNETIC RESONANCE IMAGING WITH MULTIPLE STATIONARY RECEIVE COILS FOR SENSE RECONSTRUCTION

CROSS REFERENCE TO RELATED APPLICATIONS

This application claims the benefit of U.S. provisional application Ser. No. 60/520,139 filed Nov. 14, 2003, which is incorporated herein by reference.

DESCRIPTION

The present technique relates to the magnetic resonance imaging arts. It finds particular application in conjunction with whole body imaging using the SENSE imaging technique and will be described with particular reference thereto. However, it will be appreciated that the present invention is also applicable to the scanning of other elongated regions and to other techniques using multiple stationary receive coils.

Magnetic resonance scanners have a field of view (FOV) which defines where the region of interest of the subject should be placed to generate a diagnostic image. The magnetic resonance scanner then images a volume of the patient corresponding to the field of view. Typically, when the region of interest is larger than the field of view, one end of the region of interest is positioned in the field of view and a volumetric diagnostic image is generated. The patient is then shifted just under the length of the field of view and another volumetric image is generated. In post-processing, the small region of overlap in the two volumetric images is used to align the two images and to generate a smooth transition between them. The process can then be repeated for subsequent volume images.

One of the drawbacks of stepping the patient to generate a series of volume images is that it is relatively slow and inconvenient for the patient. For example, in magnetic resonance angiography, a contrast agent is injected into the patient's circulatory system. It is advantageous to follow the bolus of contrast agent through the agent's body. The step and image technique is too slow to keep up with the moving bolus and still generate good resolution images.

One solution to this problem is to use the SENSE imaging technique in which multiple data lines are acquired concurrently. See, for example, Maki, et al., Proc. Int'l. Soc. MRM 11:257 (2003) and U.S. Pat. No. 6,552,540 to Fuderer. Although faster, this technique generates images which can be viewed as a snapshot taken when the bolus is at one location in the field of view.

It would be advantageous to move the patient continuously through the field of view while conducting imaging. Using coils that acquire a single data line per echo, the continuous patient motion and motion artifacts are negligible for individual data lines and can be corrected for all data lines. Following a bolus of contrast agent through a patient requires relatively high speeds (up to 50 mm/s). Although SENSE imaging techniques would image more quickly, the SENSE techniques rely on differences in coil sensitivity to acquire the multiple data lines concurrently. Coil sensitivity is dependent upon the patient and the portion of the patient inside the coil. In order to calibrate the sensitivity of the individual coils used in the SENSE technique for an elongated volume, a series of receive coils could be placed along the full length of the patient or the patient support, calibrated, and moved through the field of view with the patient. This would enable the coils to be precalibrated to the patient portion to which they are adjacent. However, an exceedingly large number of receive coils would be needed over the patient since $K \geq R$ coils have to cover the field of view at any time for a SENSE acceleration factor of R. Coil switching and a time consuming calibration would be necessary.

The present application contemplates a new and improved imaging technique which overcomes the above-referenced problems and others.

In accordance with one aspect of the present invention, a magnetic resonance imaging apparatus defines a fixed field of view (FOV) in which magnetic resonance is excited and phase and frequency encoded. A plurality of fixed global receive coils acquire resonance signals from the fixed field of view. A means is provided for moving a subject continuously through the fixed field of view during excitation, phase and frequency encoding of the magnetic resonance, and the acquisition of the magnetic resonance signals. In this manner, each of the fixed global receive coils receives resonance signals in parallel from the subject over an elongated virtual field of view (vFOV) which is longer than the fixed field of view. A means generates coil sensitivity patterns corresponding to the fixed field of view for the global receive coils. Another means maps the sensitivity patterns from the fixed field of view to the virtual field of view.

In accordance with another aspect of the present invention, a magnetic resonance imaging method is provided. Data is acquired with a plurality of global receive coils which are fixed with respect to a field of view through which a subject can move continuously. In this manner, the magnetic resonance signals can be acquired over a virtual field of view defined by an elongated region of the subject which is moved through the fixed field of view. Sensitivity patterns corresponding to the fixed field of view are generated for the global receive coils. The sensitivity patterns are mapped from the fixed field of view to the virtual field of view.

One advantage of the present invention is that it quickly generates a good quality image of an elongated area.

Another advantage of the present invention resides in whole-body magnetic resonance imaging.

An advantage in magnetic resonance angiography applications is that the patient can be moved longitudinally through the field of view at a speed which is substantially the same as a contrast agent bolus moves along the patient's circulatory system.

Another advantage resides in the adaptation of the SENSE imaging technique to continuously moving subjects.

Still further advantages and benefits of the present invention will become apparent to those of ordinary skill in the art upon reading and understanding the following detailed description of the preferred embodiments.

The invention may take form in various components and arrangements of components, and in various steps and arrangements of steps. The FIGURES are only for purposes of illustrating the preferred embodiments and are not to be construed as limiting the invention.

Figure 1:
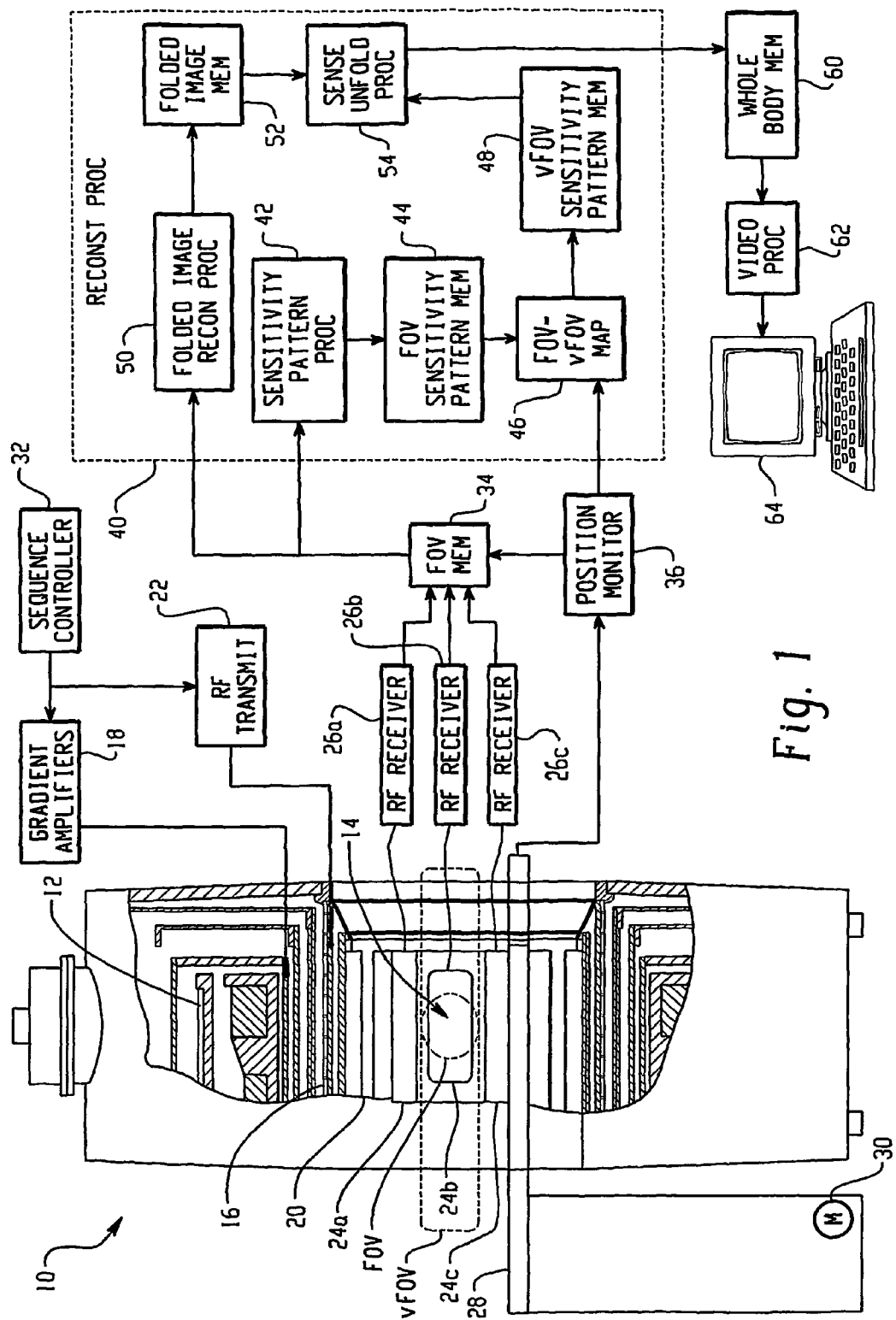
FIG. 1 is a diagrammatic illustration of a magnetic resonance imaging system in accordance with the present invention.

With reference to FIG. 1, a magnetic resonance imaging system 10 includes a main magnet assembly 12 which generates a temporally constant magnetic field $B_0$ longitudinally through an examination region 14. Gradient magnetic field coils 16 driven by gradient amplifiers 18 generate magnetic field gradients across the examination region, preferably in three orthogonal directions. A stationary whole-body RF resonance excitation coil assembly 20 with a radio frequency transmitter 22 excites and manipulates magnetic resonance of selected dipoles within the examination region 14. A plurality of fixed global receive coils 24a, 24b, and 24c is each associated with an RF receiver 26a, 26b, 26c for receiving resonance signals from the examination region 14. Although three global receive coils are illustrated for simplicity of illustration, it is to be appreciated that a larger number of receive coils and associated receivers are contemplated.

The gradient and RF coils define a field of view (FOV) centrally in the examination region within which resonance is excited and from which usable magnetic resonance signals are received for imaging.

A subject support 28 is driven by a motor 30 or other means for moving the subject support continuously through the field of view. By imaging continuously as the subject moves through the examination region, data is acquired over a virtual field of view (vFOV) corresponding to the length of the subject which is translated through the field of view. In the preferred whole-body imaging embodiment, the virtual field of view has the same transverse cross-section as the field of view, but extends the length of the subject's body.

As the motor 30 moves the subject support 28 and the subject continuously through the examination region 14, a sequence controller 32 controls the gradient amplifiers 18 and the RF transmitter 22 to conduct an imaging sequence in which data is phase and frequency encoded along selected trajectories relative to the field of view in k-space. The scanner is preferably operated in a fast field echo sequence.

In a three-dimensional preparatory measurement, the complex coil sensitivity patterns in the stationary $B_0$ field of the fixed field of view are monitored precisely. This is done for a static table position using the widest region of the patient, such as the shoulders, for the widest covering of the field of view. More specifically, the central k-space data from the three-dimensional preparatory measurement is temporarily stored in a data buffer or memory 34. A position monitor or encoder 36 determines the position of the subject support 28 to correlate the fixed field of view (FOV) of the preparatory measurement with the virtual field of view (vFOV).

A reconstruction processor 40 includes a normalizing image or sensitivity pattern reconstruction processor or means 42 which reconstructs the data from the preparatory measurement into a sensitivity pattern or normalizing image which is stored in a sensitivity pattern or normalizing image memory 44. Preferably, in another reference position, such as the abdomen, the preparatory measurement is repeated and the additional sensitivity patterns is generated and stored in the sensitivity pattern memory. A fixed field of view to virtual field of view mapping processor or means 46 maps the sensitivity patterns from the frame of reference of the fixed field of view (FOV), in which it was collected, across the virtual field of view (vFOV). The sensitivity plot is stored in a virtual field of view (vFOV) sensitivity patterns memory 48 and is used to unfold image data of the virtual field of view in a SENSE unfolding procedure as explained below.

However, because the sensitivity map of the receive coils 26a-26c varies with patient loading and because patients are typically not homogeneous along their entire length, a plurality of sensitivity patterns are preferably generated along the patient length. These additional sensitivity patterns can be generated in preliminary measurements with different selected portions of the subject in the fixed field of view, or can be generated by measurements interleaved during the imaging sequence. For example, adjacent each or selected zero crossings of k-space, a complete rather than undersampled set of central k-space data lines can be generated for the sensitivity pattern reconstruction processor 42 to use to update the sensitivity patterns.

Figure 2A:
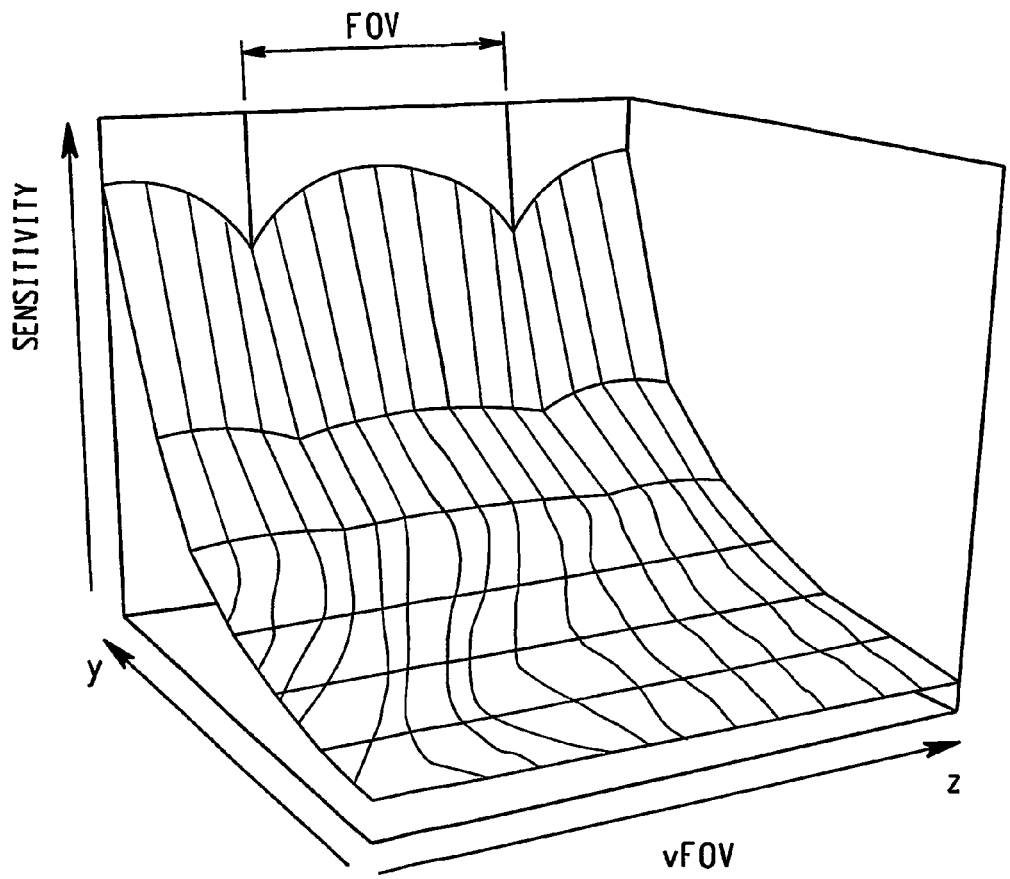
FIG. 2A illustrates a linear phase-encoding trajectory versus time.

With reference to FIG. 2A, in a preferred embodiment, image data is generated along linear trajectories through k-space starting at a maximum negative phase encoding and steps progressively with time through the zero phase encode point to the maximum positive phase encoding. The continuous subject motion or z-direction is chosen parallel to the frequency encoding direction (readout) of the magnetic resonance sequence. The phase encoding is performed in a perpendicular direction (x, y). The sequence is then repeated, all of the time the subject moving continuously through the field of view. The plurality of global receive coils 26a, 26b, 26c read out an undersampled plurality of data lines of k-space concurrently in the field of view frame of reference. The data lines for each receive coil are optionally stored or buffered in corresponding portions of the field of view frame of reference memory or buffer 34 along with subject support position information which translates the image data into the virtual field of view (vFOV) from the fixed field of view (FOV).

The data from each of the global receive coils is forwarded to a folded image data reconstruction processor or means 50 of the reconstruction processor 40 which reconstructs the undersampled data from each global receive coil into folded images which are stored in a folded image memory or buffer 52. An SENSE unfolding processor or means 54 combines and unfolds the folded images using the sensitivity pattern mapped to the virtual field of view from the vFOV sensitivity pattern memory 44 to form a single whole-body image corresponding to the entire virtual field of view. The whole-body image is stored in a whole-body or virtual field of view image memory 60. A video processor 62 withdraws selected portions of the whole body image and formats the image data into appropriate form for display on a monitor 64.

Figure 2B:
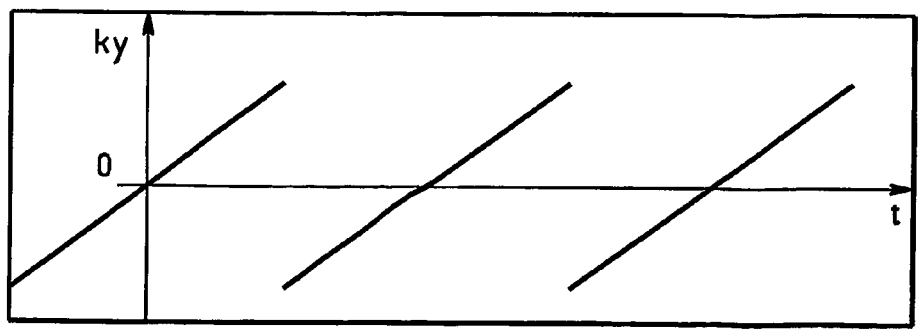
FIG. 2B illustrates a composition of a virtual field of view sensitivity map for an exemplary one of the receive coils with the linear acquisition order of FIG. 2A.

With reference to FIG. 2B, although the relationship between the continuously traveling virtual field of view (vFOV) and the fixed field of view (FOV) is a complex relationship, the coil sensitivity patterns are smooth functions of space. The mapping means 46 maps the coil sensitivity pattern of each coil to areas inside the virtual field of view corresponding to the image data at the point of time when the k=0 acquisitions are to be collected to the virtual field of view. The sensitivity in k-space concentrates on low, central spatial frequencies. FIG. 2B illustrates a composition of the virtual field of view sensitivity map 46 for one of the receive coils acquiring data using the linear acquisition order of FIG. 2A, in which the scanning sequence passes periodically through k=0. In the illustrated linear case, the sensitivity pattern corresponding to the k=0 measurement is used for all data lines within the corresponding linear sweep through k-space. When high spatial frequencies are acquired toward the edges of k-space, the longitudinal translation of the patient causes the sensitivity pattern to be displaced from the assumed area within the virtual field of view. Although in principle, this could lead to high frequency ghosting in the SENSE reconstruction, under practical conditions it has been found that the effect is negligible and can be ignored. Variations of the coil sensitivity pattern in the direction of motion are smooth functions.

In an exemplary embodiment in which the subject is moving at 40 millimeters/second through a 20-35 centimeter field of view, and a voxel size of 1 millimeter and a readout of 4 milliseconds, the motion during one data line acquisition is significantly less than a voxel. Thus motion artifacts in the data line readout are negligible. A typical virtual field of view extends 2.0 meters.

In a more specific embodiment, the fixed field of view is 25 centimeters and the virtual field of view is 2.0 meters. In a preliminary setup mode, at least low frequency data lines are generated for eight 25 centimeter fixed fields of view which end-to-end, span the virtual field of view. The low frequency data for each of the six fixed fields of view is reconstructed into sensitivity patterns, which sensitivity patterns are mapped from the fixed field of view to the virtual field of view. Then, during the continuous motion and data acquisition, the patient is moved at a speed relative to the data acquisition speed such that the patient moves 25 centimeters in the time that it takes to collect the data along one repetition of the k-space trajectory. The image data collected along the k-space trajectory is reconstructed into folded images which are unfolded using the sensitivity pattern in the vFOV.

Figure 3A:
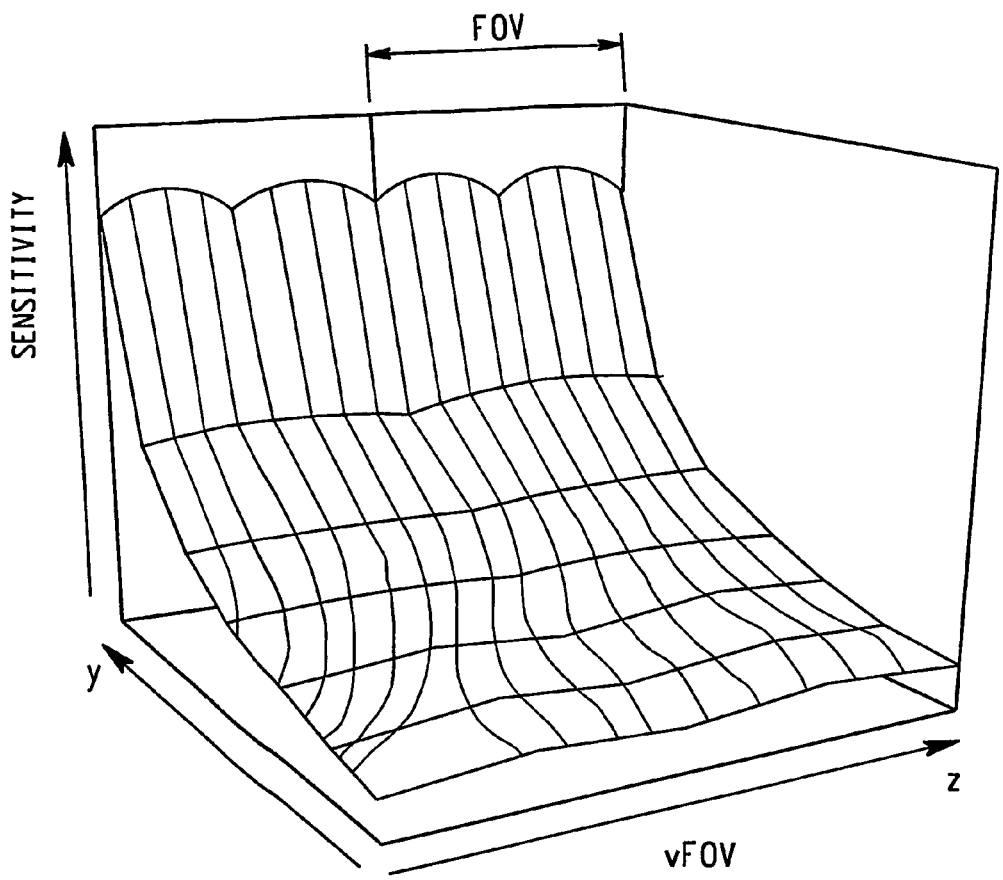
FIG. 3A illustrates a subsequent high and low spatial frequency scanning order.
Figure 3B:
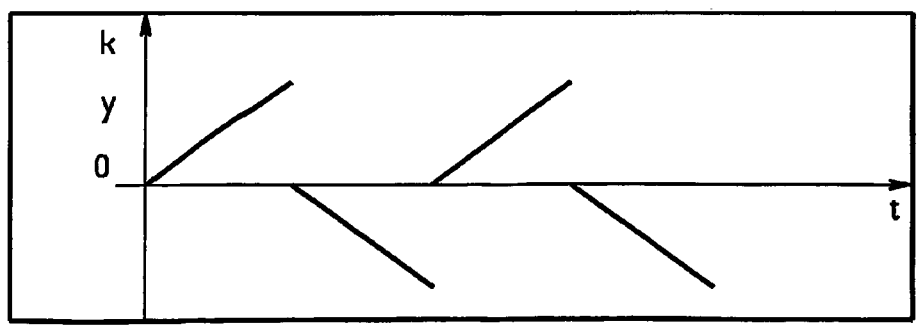
FIG. 3B illustrates the composition of the virtual field of view sensitivity map for one of the receive coils using the acquisition order of FIG. 3A.

Rather than sampling k-space linearly as illustrated in FIG. 1, other k-space sampling patterns are also contemplated. For example, as illustrated in FIG. 3A, k-space is sampled starting at zero and working alternately to the opposite high frequency portions of k-space. The alternate high and low spatial frequency scanning leads to a more complicated mapping between the field of view and the virtual field of view as illustrated in FIG. 3B with a double periodicity. Other mappings of k-space, such as spiral, radial, and the like as are known in the art are also contemplated.

The invention has been described with reference to the preferred embodiments. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus in which a fixed field of view is defined in which magnetic resonance is excited and phase and frequency are encoded, the apparatus including:
   a plurality of fixed global receive coils for receiving resonance signals from the fixed field of view;
   a means for moving a subject continuously through the fixed field of view during the excitation, phase and frequency encoding of magnetic resonance and the reception of the magnetic resonance, such that each of the fixed global receive coils receives resonance signals from the subject over an elongated virtual field of view, longer than the fixed field of view;
   a means for generating coil sensitivity patterns from static reference acquisitions corresponding to the fixed field of view for the fixed global receive coils;
   a folded image reconstruction means for reconstructing the k-space resonance signals corresponding to the global receive coils into corresponding folded image representations;
   a means for reconstructing fully sampled central regions of k-space into additional sensitivity patterns in the field of view corresponding to each of the global receive coils during the continuous movement;
   a means for mapping the sensitivity patterns from the fixed field of view corresponding to the global receive coils to the virtual field of view and for mapping the additional sensitivity patterns from the fixed field of view into the virtual field of view; and
   a SENSE reconstruction means for unfolding and combining the folded image representations in accordance with the sensitivity patterns mapped into the virtual field of view.

2. The magnetic resonance imaging apparatus according to claim 1, further including:
   a plurality of receivers each connected with a corresponding one of the global receive coils.

3. The magnetic resonance imaging apparatus according to claim 1, further including:
   a sequence control processor for, during the continuous motion, repeatedly causing the generation of magnetic resonance data along a k-space trajectory which passes through central and high frequency regions of k-space.

4. A method of magnetic resonance imaging comprising:
   acquiring data with a plurality of global receive coils which are fixed with respect to a field of view through which a subject can move continuously such that magnetic resonance signals can be acquired over a virtual field of view defined by an elongated region of the subject which is moved through the fixed field of view during the continuous motion and data acquisition;
   generating sensitivity patterns corresponding to the fixed field of view for the global receive coils; and
   mapping the sensitivity patterns from the fixed field of view to the virtual field of view.

5. The method according to claim 4, further including:
   receiving undersampled resonance data with the plurality of global receive coils as the subject moves continuously through the fixed field of view;
   reconstructing the undersampled magnetic resonance data into folded image representations; and
   combining and unfolding the folded image representations in accordance with the sensitivity pattern mapped into the virtual field of view.

6. The method according to claim 5, further including:
   repeatedly generating magnetic resonance data along a k-space trajectory which repeatedly passes through low spatial sampling frequencies.

7. The method according to claim 6, wherein the sensitivity pattern mapped into the virtual field of view corresponding to magnetic resonance data when the trajectory crosses a center of k-space is used in conjunction with all magnetic resonance data of the corresponding k-space trajectory.

8. The method according to claim 6, wherein the k-space data is acquired in a linear k-space trajectory starting at one high frequency extreme and passing through a central region of k-space to the other high frequency extreme.

9. The method according to claim 6, wherein the k-space data is acquired along k-space trajectories extending between a central region of k-space and high frequency extremes of k-space alternately.

10. The method according to claim 6, wherein k-space data is undersampled by each global receive coil at least in high frequency regions and further including:
    at least periodically fully sampling k-space data adjacent a low frequency region of k-space; and
    updating and remapping the sensitivity patterns in accordance with the fully sampled low frequency k-space regions.

11. The method according to claim 6, wherein the subject moves continuously through the fixed field of view in a longitudinal direction and further including:
- exciting and frequency encoding magnetic resonance parallel to the longitudinal direction of motion; and
- phase encoding the magnetic resonance perpendicular to the longitudinal direction.

12. The method according to claim 11, wherein the imaging sequence includes generating fast field echoes.

13. A magnetic resonance imaging scanner including a main magnet for generating a spatially constant magnetic field through the examination region, an RE system for exciting, manipulating, and acquiring magnetic resonance signals, and a gradient magnetic field system for creating magnetic field gradients across the examination region, and further including:
- a processor for performing the method of claim 4.

14. A method of magnetic resonance imaging comprising:
- acquiring data with a plurality of global receive coils which are fixed with respect to a field of view through which a subject can move continuously such that magnetic resonance signals can be acquired over a virtual field of view defined by an elongated region of the subject which is moved through the fixed field of view during the continuous motion and data acquisition;
- generating sensitivity patterns corresponding to the fixed field of view for the global receive coils;
- mapping the sensitivity patterns from the fixed field of view to the virtual field of view;
- receiving undersampled resonance data with the plurality of global receive coils as the subject moves continuously through the fixed field of view;
- reconstructing the undersampled magnetic resonance data into folded image representations;
- combining and unfolding the folded image representations in accordance with the sensitivity pattern mapped into the virtual field of view;
- repeatedly generating magnetic resonance data along a k-space trajectory which repeatedly passes through low spatial sampling frequencies;
- collecting at least low frequency spatial frequency data in static acquisitions at a plurality of locations along the subject in a direction of the continuous motion;
- generating additional sensitivity patterns in the fixed field of view corresponding to each of the locations; and
- mapping the additional sensitivity patterns to the virtual field of view.

15. The method according to claim 14, wherein each generated sensitivity pattern in the fixed field of view corresponds to one of the k-space trajectories.

16. The method according to claim 15, wherein the locations at which the at least low spatial frequency data is collected are spaced by a distance commensurate with a distance that the subject moves during the corresponding k-space trajectories.

* * * * *